(12) United States Patent
Bustraan et al.

(10) Patent No.: US 12,399,436 B2
(45) Date of Patent: Aug. 26, 2025

(54) SUBSTRATE HOLDER, CARRIER SYSTEM COMPRISING A SUBSTRATE HOLDER AND LITHOGRAPHIC APPARATUS

(71) Applicant: ASML NETHERLANDS B.V., Veldhoven (NL)

(72) Inventors: Krijn Frederik Bustraan, Eindhoven (NL); Arjan Gijsbertsen, Vught (NL); Paul Van Dongen, Wilton, CT (US); Ibrahim Acan, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 243 days.

(21) Appl. No.: 18/027,094

(22) PCT Filed: Aug. 20, 2021

(86) PCT No.: PCT/EP2021/073138
§ 371 (c)(1),
(2) Date: Mar. 18, 2023

(87) PCT Pub. No.: WO2022/073679
PCT Pub. Date: Apr. 14, 2022

(65) Prior Publication Data
US 2023/0333488 A1      Oct. 19, 2023

(30) Foreign Application Priority Data

Oct. 8, 2020   (EP) ..................................... 20200811
Oct. 23, 2020  (EP) ..................................... 20203644
Aug. 9, 2021   (EP) ..................................... 21190373

(51) Int. Cl.
G03F 7/00     (2006.01)

(52) U.S. Cl.
CPC ............................... G03F 7/70716 (2013.01)

(58) Field of Classification Search
CPC ............ G03F 7/70716; G03F 7/70783; G03F 7/70775; H01L 21/67288; H01L 21/6831;
(Continued)

(56) References Cited

U.S. PATENT DOCUMENTS 4,711,438 A * 12/1987 Guarino .................... B25B 5/06
                                                      269/254 CS
6,952,253 B2   10/2005 Lof et al.
(Continued)

FOREIGN PATENT DOCUMENTS

EP      2168727        3/2010
EP      2950329        12/2015
(Continued)

OTHER PUBLICATIONS

Office Action issued in the corresponding Taiwanese Patent Application No. 110133311, dated Mar. 29, 2023.
(Continued)

Primary Examiner — Hung V Nguyen
(74) Attorney, Agent, or Firm — Pillsbury Winthrop Shaw Pittman, LLP

(57) ABSTRACT

A substrate holder to hold a substrate in a substrate holding position, the substrate holder including: a frame, multiple surface clamping devices arranged on the frame to clamp a substrate at an upper surface thereof, wherein the surface clamping devices each have a clamping pad to be arranged on the upper surface of the substrate, the surface clamping pads being movable with respect to each other at least in a first direction substantially perpendicular to the upper surface of a substrate held by the surface clamping pads, and one or more actuators to move the surface clamping pads with respect to each other in the first direction.

20 Claims, 4 Drawing Sheets

(58) Field of Classification Search
CPC ........... H01L 21/6838; H01L 21/68735; H01L 21/6875
See application file for complete search history.

(56) References Cited

U.S. PATENT DOCUMENTS

| | | | | |
|---|---|---|---|---|
| 7,295,287 | B2 * | 11/2007 | Yamamoto | G03F 7/70708 |
| | | | | 355/75 |
| 8,616,598 | B2 | 12/2013 | Cadee et al. | |
| 9,421,617 | B2 * | 8/2016 | Goodman | B23B 31/1261 |
| 11,887,882 | B2 * | 1/2024 | Matsuyama | H01L 21/67057 |
| 2001/0018322 | A1 | 8/2001 | Dow | |
| 2004/0005212 | A1 | 1/2004 | Wu | |
| 2016/0005636 | A1 | 1/2016 | Ichinose et al. | |
| 2016/0023356 | A1 | 1/2016 | Hara | |
| 2016/0356597 | A1 | 12/2016 | Park et al. | |
| 2020/0176298 | A1 | 6/2020 | Ichinose et al. | |

FOREIGN PATENT DOCUMENTS

| | | |
|---|---|---|
| JP | H09148395 | 6/1997 |
| JP | 2001353682 | 12/2001 |
| JP | 2008227199 | 9/2008 |
| JP | 2010076929 | 4/2010 |
| JP | 2011091070 | 5/2011 |
| JP | 2013-191601 | 9/2013 |
| JP | 2019129286 | 8/2019 |
| TW | 201324679 | 6/2013 |
| WO | 2008/149372 | 12/2008 |
| WO | 2012/083978 | 6/2012 |
| WO | 2016/206839 | 12/2016 |

OTHER PUBLICATIONS

Office Action issued in corresponding Japanese Patent Application No. 2023-518088, dated Feb. 29, 2024.
International Search Report and Written Opinion issued in corresponding PCT Patent Application No. PCT/EP2021/073138, dated Nov. 30, 2021.
Office Action issued in corresponding Taiwanese Patent Application No. 110133311, dated Oct. 21, 2022.
Anonymous, "Fast Wafer Edge Gripper with Optional Top Loader for Handling Warped Wafers and Faster Wafer Exchange by a Top Side Wafer Handler with Bottom Clamping", Research Disclosure 664041, pp. 1-9 (Aug. 2019).

* cited by examiner

SUBSTRATE HOLDER, CARRIER SYSTEM COMPRISING A SUBSTRATE HOLDER AND LITHOGRAPHIC APPARATUS

CROSS-REFERENCE TO RELATED APPLICATION

The application is the U.S. national phase entry of PCT Application No. PCT/EP2021/073138 which was filed on Aug. 20, 2021. which claims priority of European Patent Application No. Ser. No. 20200811.6 which was filed on Oct. 8, 2020, of European Patent Application No. Ser. No. 20203644.8 which was filed on Oct. 23, 2020 and of European Patent Application No. Ser. No. 21190373.7 which was filed on Aug. 9, 2021 and which are incorporated herein in their entireties by reference.

FIELD

The present invention relates to a substrate holder, a carrier system comprising a substrate holder and a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a lithographic apparatus, one or more substrate holders are used to handle substrates, for example to load and unload a substrate on and from a substrate support on which the substrate is supported during the lithographic process.

In a known embodiment of a substrate holder, the substrate holder comprises a gripping device on the top side of which the substrate is supported. Non-contact surface clamping pads, such as vortex pads, are used to hold the substrate in a fixed position on the gripping device. To load the substrate on a substrate support, the substrate support is provided with loading pins which are movable in vertical direction out of the support surface of the substrate support. The substrate holder may be supported by a carrier system that can arrange the substrate loader in a position to load the substrate on the extended e-pins. Subsequently, the loading pins can be lowered to place the substrate on the support surface of the substrate support. The support surface of the substrate support may comprise burls on which the substrate is supported.

In an alternative embodiment of a substrate holder, the substrate is held at a bottom side of the substrate holder, for example by surface clamping pads. To load the substrate on the substrate support, the substrate can be lowered by the substrate holder, until the substrate is supported on the support surface of the substrate support, or on loading pins of the substrate support.

Loading a substrate on the substrate support may be a challenging task in case the substrate has a substantial deformation. Ideally, a substrate is completely flat or slightly bowl-shaped. This allows a low-stress loading of the substrate on the substrate support with a minimum of slip of the substrate over the support surface of the substrate support. In practice, the substrate may show considerable deformation. The substrate may for example have an umbrella shape, a bowl shape, a saddle shape, and other shapes. Loading a deformed substrate on the substrate stage may lead to internal stresses in the loaded substrate and/or substantial slip over the support surface, for example over the burls of the support surface. The internal stress in the substrate may lead to overlay errors, while the slipping of the substrate over the support surface may lead to wear of the support surface of the substrate support, in particular the burls thereof.

The wear of the support surface of the substrate support may lead to support surface flatness drift and substrate load grid drift due to differences in roughness of the burls. Also, the wear of the support surface may lead to overlay issues.

SUMMARY

It is an object of the invention to provide a substrate holder which may improve the loading of deformed substrates on the support surface of a substrate support.

According to an aspect of the invention there is provided a substrate holder to hold a substrate in a substrate holding position, comprising:
  a frame,
  multiple surface clamping devices arranged on the frame to clamp a substrate at an upper surface thereof, wherein the surface clamping devices each have a clamping pad to be arranged on the upper surface of the substrate, the surface clamping pads being movable with respect to each other at least in a first direction substantially perpendicular to the upper surface of a substrate held by the surface clamping pads, and
  one or more actuators to move the surface clamping pads with respect to each other in the first direction.

According to an aspect of the invention, there is provided a substrate holder to hold a substrate in a substrate holding position, comprising:
  a frame, three or more edge grippers mounted on the frame to hold the substrate at a circumferential edge thereof, wherein at least one of the three or more edge grippers is individually movable with respect to the frame in a gripping direction, wherein the gripping direction extends in radial direction with respect to a center axis of the substrate holding position, and
  an edge gripper actuator to move the edge gripper in the gripping direction, and
  one or more edge detection devices configured to detect whether the one or more edge grippers contact the circumferential edge of the substrate to be held, wherein the substrate holder is arranged to, during gripping of the substrate, move each of the one or more edge grippers towards the edge of the substrate and stop movement of each of the one or more edge grippers when the one or more edge detection devices detect that the respective edge gripper contacts the circumferential edge of the substrate.

According to an aspect of the invention, there is provided a carrier system for supporting a substrate, comprising a substrate holder to hold a substrate in a substrate holding position, comprising:

a frame, multiple surface clamping devices arranged on the frame to clamp a substrate at an upper surface thereof, wherein the surface clamping devices each have a clamping pad to be arranged on the upper surface of the substrate, the surface clamping pads being movable with respect to each other at least in a first direction substantially perpendicular to the upper surface of a substrate held by the surface clamping pads, and one or more actuators to move the surface clamping pads with respect to each other in the first direction.

According to an aspect of the invention, there is provided a carrier system comprising a substrate holder to hold a substrate in a substrate holding position, comprising:

a frame, three or more edge grippers mounted on the frame to hold the substrate at a circumferential edge thereof, wherein at least one of the three or more edge grippers is individually movable with respect to the frame in a gripping direction, wherein the gripping direction extends in radial direction with respect to a center axis of the substrate holding position, and an edge gripper actuator to move the edge gripper in the gripping direction, and one or more edge detection devices configured to detect whether the one or more edge grippers contact the circumferential edge of the substrate to be held, wherein the substrate holder is arranged to, during gripping of the substrate, move each of the one or more edge grippers towards the edge of the substrate and stop movement of each of the one or more edge grippers when the one or more edge detection devices detect that the respective edge gripper contacts the circumferential edge of the substrate.

According to an aspect of the invention, there is provided a lithographic apparatus for supporting a substrate, comprising a substrate holder to hold a substrate in a substrate holding position, comprising:

a frame, multiple surface clamping devices arranged on the frame to clamp a substrate at an upper surface thereof, wherein the surface clamping devices each have a clamping pad to be arranged on the upper surface of the substrate, the surface clamping pads being movable with respect to each other at least in a first direction substantially perpendicular to the upper surface of a substrate held by the surface clamping pads, and one or more actuators to move the surface clamping pads with respect to each other in the first direction.

According to an aspect of the invention, there is provided a lithographic apparatus comprising a substrate holder to hold a substrate in a substrate holding position, comprising:

a frame, three or more edge grippers mounted on the frame to hold the substrate at a circumferential edge thereof, wherein at least one of the three or more edge grippers is individually movable with respect to the frame in a gripping direction, wherein the gripping direction extends in radial direction with respect to a center axis the substrate holding position, and an edge gripper actuator to move the edge gripper in the gripping direction, and one or more edge detection devices configured to detect whether the one or more edge grippers contact the circumferential edge of the substrate to be held, wherein the substrate holder is arranged to, during gripping of the substrate, move each of the one or more edge grippers towards the edge of the substrate and stop movement of each of the one or more edge grippers when the one or more edge detection devices detect that the respective edge gripper contacts the circumferential edge of the substrate.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
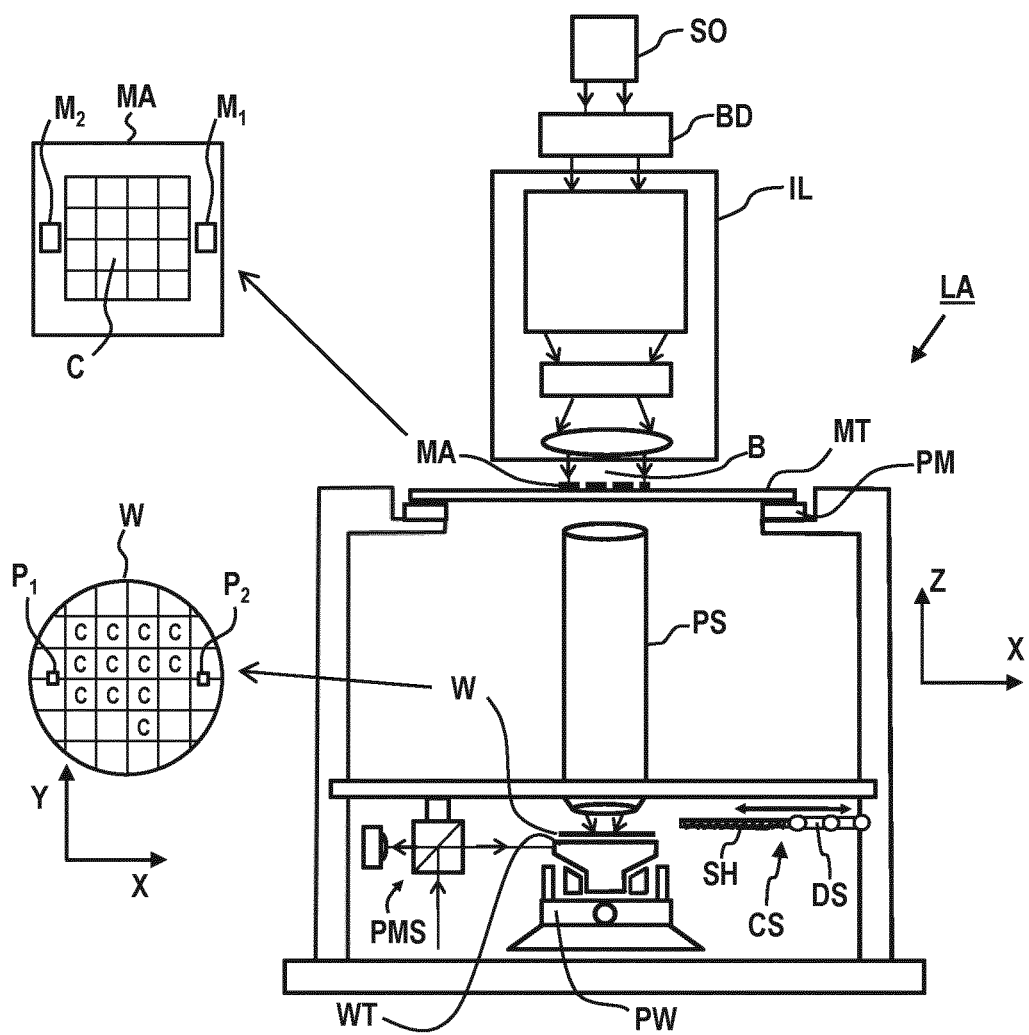
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In the lithographic apparatus LA of FIG. 1, a carrier system CS is provided. The carrier system CS is configured to transport a substrate W, between the substrate support WT and another location, for example a substrate storage. The carrier system CS comprises a substrate holder SH and a displacement system DS, for example a robotic system or a linear movement system. A robotic system may be a Selective Compliance Articulated Robot Arm (SCARA) robot. A linear movement system may be a linear stage with a pivot for Rz-rotation. A linear stage advantageously has sub-micron reproducibility and high stiffness. The substrate holder SH may also be used to hold a substrate in other devices related to the processing of substrates in the lithographic process, in which handling of the substrate with high accuracy is desired.

Figure 2:
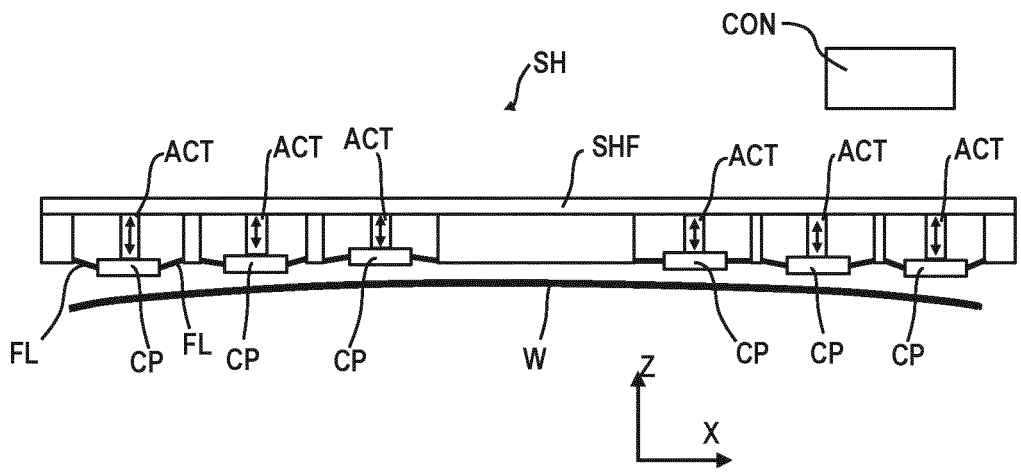
FIGS. 2 and 3 depict schematically a cross-section of a first embodiment of a substrate holder according to an aspect of the invention.

FIG. 2 shows a first embodiment of a substrate holder SH according to an aspect of the invention. The substrate holder SH comprises a substrate holder frame SHF and a number of surface clamping pads CP. The surface clamping pads CP are for example vortex pads that allows to pull or push the substrate W by air pressure or pressure created by another medium. The air or other medium used for the clamping pads CP may be supplied or discharged through a number of conduits that may be provided on or in the substrate holder frame SHF. For instance, the substrate holder frame SHF may be a hollow frame having internal channels that can be used to transport air or another medium.

In other embodiments, other types of surface clamping pads such as Bernoulli clamping pads or electrostatic clamping pads may be used. The surface clamping pads CP may be non-contact surface clamping pads, i.e. able to clamp the substrate without mechanical contact between the surface clamping pad CP and the substrate W, or contact surface clamping pads, i.e. able to clamp the substrate with mechanical contact between the surface clamping pad CP and the substrate W. Vortex pads are of the non-contact type.

The surface clamping pads CP are mounted on the substrate holder frame SHF through piezo actuators ACT that allow the surface clamping pads CP to be moved individually in z-direction with respect to the substrate holder frame SHF. In alternative embodiments, other types of actuators may also be applied. Advantageously the actuators are position actuators that allow a high accuracy of position control of the surface clamping pads CP. Flexures FL are provided between the surface clamping pads CP and the substrate holder frame SHF to guide the movement of the surface clamping pads CP with respect to the substrate holder frame in z-direction. The range of movement of the surface clamping pads CP in z-direction may for example in the range of +/−1 mm, for instance in the range of +/−0.3 mm. One or more cooling devices may be provided to compensate heat load caused by the piezo actuators ACT.

By controlling the individual positions in z-direction of the individual surface clamping pads CP with respect to each other, the shape of the substrate W may be influenced. A controller CON is arranged to provide control signals to the piezo actuators ACT to position the surface clamping pads CP in the desired position with respect to each other. In FIG. 2, the positions of the piezo actuators ACT are selected in order to hold a warped substrate W having an umbrella shape. These positions may for example be based on a shape measurement of the substrate W before the substrate W is loaded on the substrate holder SH. This shape measurement can be done in stress-free state of the substrate W and fed as a feedforward signal to the controller CON to adapt the positions of the surface clamping pads CP to the shape of the substrate W before it is held by the surface clamping pads CP. When the substrate W is held by the substrate holder SH, the shape of the substrate W may be measured/determined in order to determine proper movements of the surface clamping pads CP with respect to each other. The piezo actuators ACT may be used to obtain feedback on the actual position of the surface clamping pads CP and therewith the actual shape of the substrate held by the surface clamping pads CP. As an alternative or additionally, other types of shape sensors may be provided with which the shape of the substrate W can be determined. Also a feedback signal of the actuator force can be used, since the stiffness of the substrate W is known.

The umbrella shape of the substrate W is undesirable for loading the substrate W on a support surface of a substrate support WT as this may lead to overlay errors and wear of the support surface of the substrate support WT.

Figure 3:
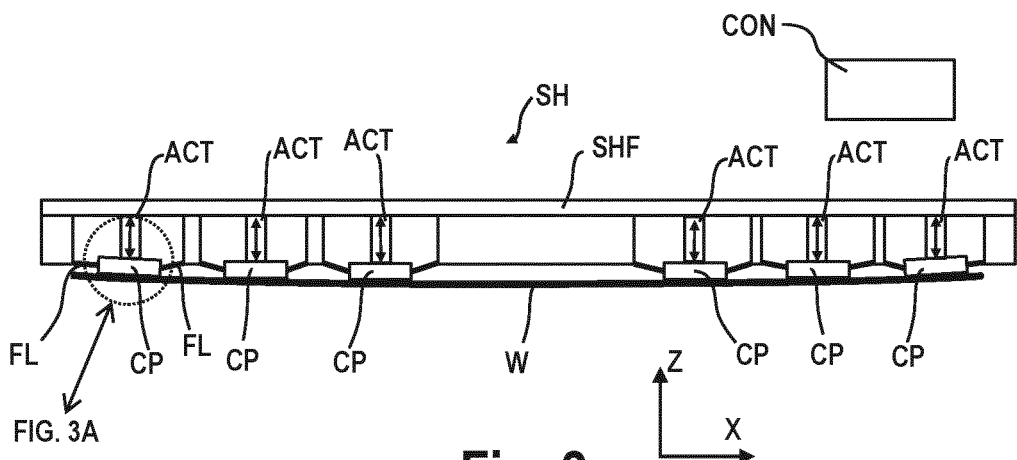

FIG. 3 shows that adapting the positions of the surface clamping pads CP with respect to each other may be used to adapt the shape of the substrate W to a more desirable shape such as a flat shape or a slightly bowl shape as depicted in FIG. 3. When the substrate W is held by the surface clamping pads CP, the controller CON may control the piezo actuators ACT to move the surface clamping pads CP to the desired position to obtain the bowl shape. An advantage of piezo actuators ACT is that the position of the surface clamping pads CP can be accurately controlled by the actuation signals of the controller CON. In this example the inner surface clamping pads CP push the substrate W downwards (negative z-direction) while the outer surface clamping pads CP pull the substrate W upwards (positive z-direction) to obtain the desired shape.

Figure 3A:
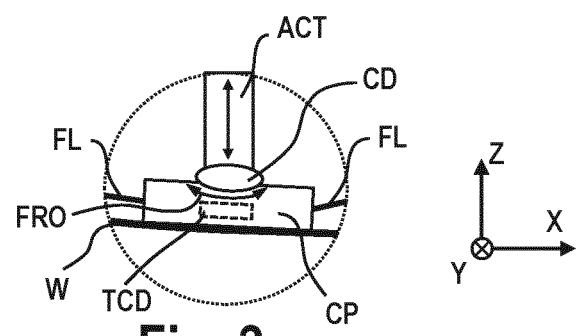
FIG. 3a depicts a detail of FIG. 3.

FIG. 3A shows a part of FIG. 3 showing a surface clamping pad CP in more detail. It can be seen that there is provided a connection device CD that allows free rotation of the surface clamping pad CP with respect to the horizontal axes Rx, Ry over a limited angle of rotation, for example up to 50 mrad on the upper surface of the substrate W. The free rotation about Ry is indicated in FIG. 3a by an arrow FRO. This free rotation facilitates each of the surface clamping pads CP to adapt its rotational position to the upper surface of the substrate. For example, the surface clamping pad CP may adapt its rotational position when it is placed during clamping of the substrate W on the upper surface of the substrate or when the shape of the substrate W is actively changed by adapting the relative positions of the surface clamping pads CP in z-direction. Each of the surface clamping pads CP may be provided with a connection device CD that may allow free rotation of the surface clamping pads CP about one or more horizontal axes.

In FIG. 3A also a temperature control device TCD is shown in the clamping pad CP. Each of the clamping pads CP may be provided with a temperature control device TCD, for example a heating element, to control its temperature individually. This temperature control may be desirable to correct for the cooling caused by air expansion of the air used in the clamping pad CP. Each individual clamping pad CP may be provided with an individual temperature control device TCD or one temperature control device TCD may be provided for a group of clamping pads CP.

Figure 4:
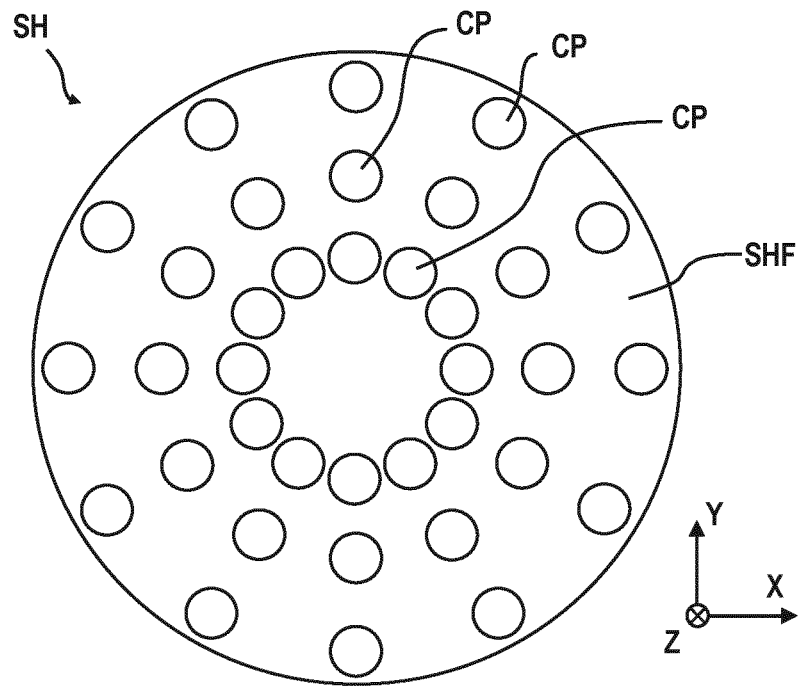
FIG. 4 depicts schematically, in bottom view, a configuration of surface clamping pads of a substrate holder shown in FIGS. 2 and 3.

FIG. 4 shows a bottom view of the configuration of the surface clamping pads CP of the embodiment of FIG. 2. The surface clamping pads CP are arranged in three concentric circles, whereby in radial direction each surface clamping pad CP of one circle is aligned with one of each of the other two circles.

In alternative configurations, various amounts of surface clamping pads CP with different mutual positions can be used. To optimize wafer shaping capacity a large number of surface clamping pads CP is beneficial. This should be balanced with the desired flow capacity per surface clamping pad CP, for example about 20 NL/min per surface clamping pad and associated equipment. Also, the total mass of the surface clamping pads CP should be taken into account.

Advantageously, there should be a minimum of surface clamping pads CP in radial direction (from substrate center axis outwards) to be able to apply a moment on the substrate by two opposite forces in z-direction provided by the two surface clamping pads CP and associated piezo actuators ACT. Then a first order wafer shape can be compensated, such as bowl/umbrella, saddle and half pipe. Also three surface clamping pads CP, as shown in the embodiment of FIGS. 2-4, or more surface clamping pads CP can be provided in radial direction to allow compensation of second or higher order shape deformations. More generally, more surface clamping pads CP can be used to have more possibilities for adapting the shape of the substrate held by the substrate holder SH. The mutual positions between the surface clamping pads CP, such as rings, rows, etc. can be selected to optimize the shaping capabilities for specific shapes of deformed substrates.

In an embodiment, one or more of the clamping pads CP can be retracted by the associated actuator ACT to a retracted position in which the respective clamping pad CP will not be able to apply a force to the substrate W held by the substrate holder SH, for example by other non-retracted clamping pads CP.

In the embodiment of FIGS. 2 and 3, each of the surface clamping pads CP can be individually moved by its own associated piezo actuator ACT. In other embodiments, it is possible that two or more surface clamping pads CP are associated with one piezo actuator. For example, each ring of surface clamping pads CP may be subdivided in a number of ring segments comprising two or more surface clamping pads CP. Each ring segment comprising two or more surface clamping pads CP may be associated with one piezo actuator to move the respective ring segment to a desired position. For example, each of the three rings of the configuration shown in FIG. 4 may be subdivided in four ring segments, each ring segment comprising three surface clamping pads CP. For each of these ring segments a respective actuator may be provided to move the ring segment to a desired position in z-direction.

Figure 5:
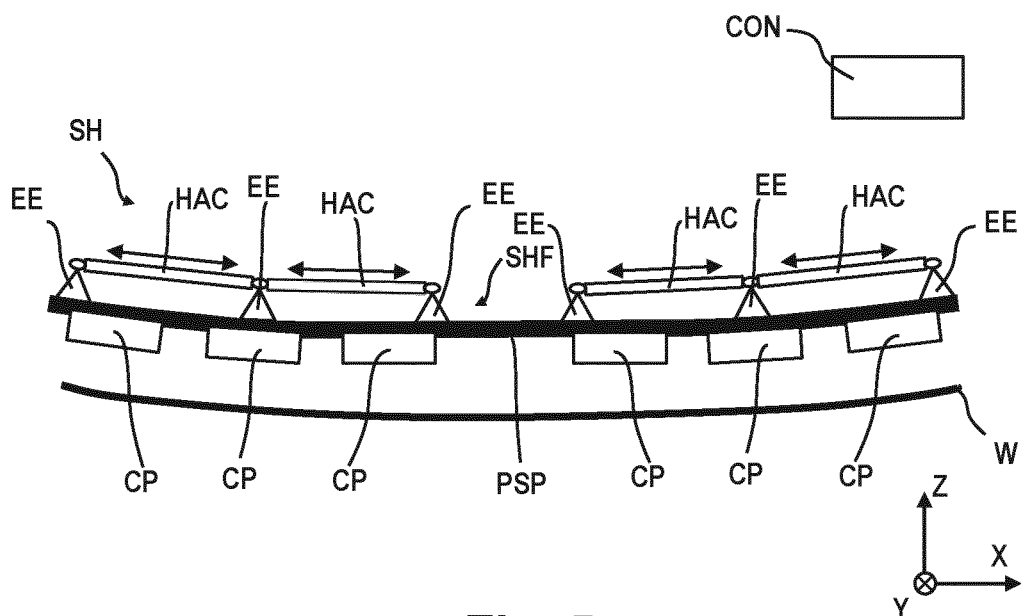
FIG. 5 depicts schematically a cross-section of a second embodiment of a substrate holder according to an aspect of the invention.

FIG. 5 shows a second embodiment of a substrate holder SH according to an aspect of the invention. In this embodiment, the surface clamping pads CP are arranged on a substrate holder frame SHF comprising a support plate PSP and extension elements EE. The surface clamping pads CP are mounted on the support plate PSP and distributed according to a desired configuration. The extension elements EE are mounted on the top side of the support plate PSP. The top ends of the extension elements EE are positioned above the neutral bending line of the support plate PSP. Between the top elements piezo actuators HAC are arranged. By elongation and contraction of a piezo actuator HAC the top ends of the extension elements EE between which the piezo actuator HAC is mounted can be pushed away from each other and pulled towards each other, respectively. As a result, the support plate PSP may be deformed, i.e. bent, which results in a relative movement in z-direction of the surface clamping pads CP with respect to each other. In an embodiment, the support plate PSP may be provided with openings, recesses, slots or other arrangements in shape or material to facilitate the bending of the support plate PSP at the desired locations.

The surface clamping pads CP of FIG. 5 are arranged in three concentric circles corresponding to the configuration shown in FIG. 4. The piezo actuators HAC extend in the radial direction. This configuration allows to arrange the support plate PSP and therewith the surface clamping pads CP in several typical shapes, such as bowl shaped, umbrella shaped, saddle shaped, half pipe shaped and flat. In a further embodiment, adjacent extension elements EE in the same ring may also be connected to each other by piezo actuators HAC to increase the possibilities for shaping the support plate PSP to the desired shape. Any other suitable configuration, such as two or four concentric rings, or a regular pattern of rows and columns may also be used.

Figure 6:
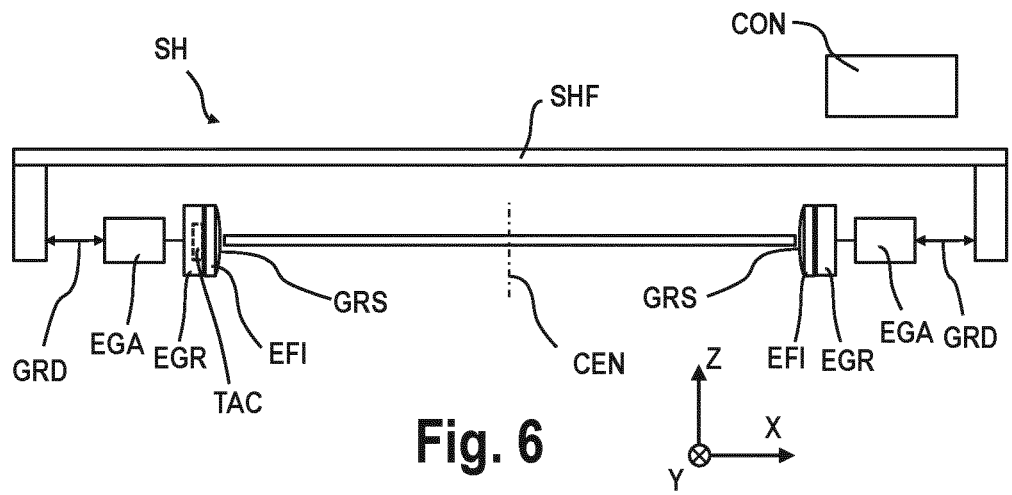
FIGS. 6 and 7 depict schematically a cross-section and top view of an embodiment of a substrate holder according to another aspect of the invention.
Figure 7:
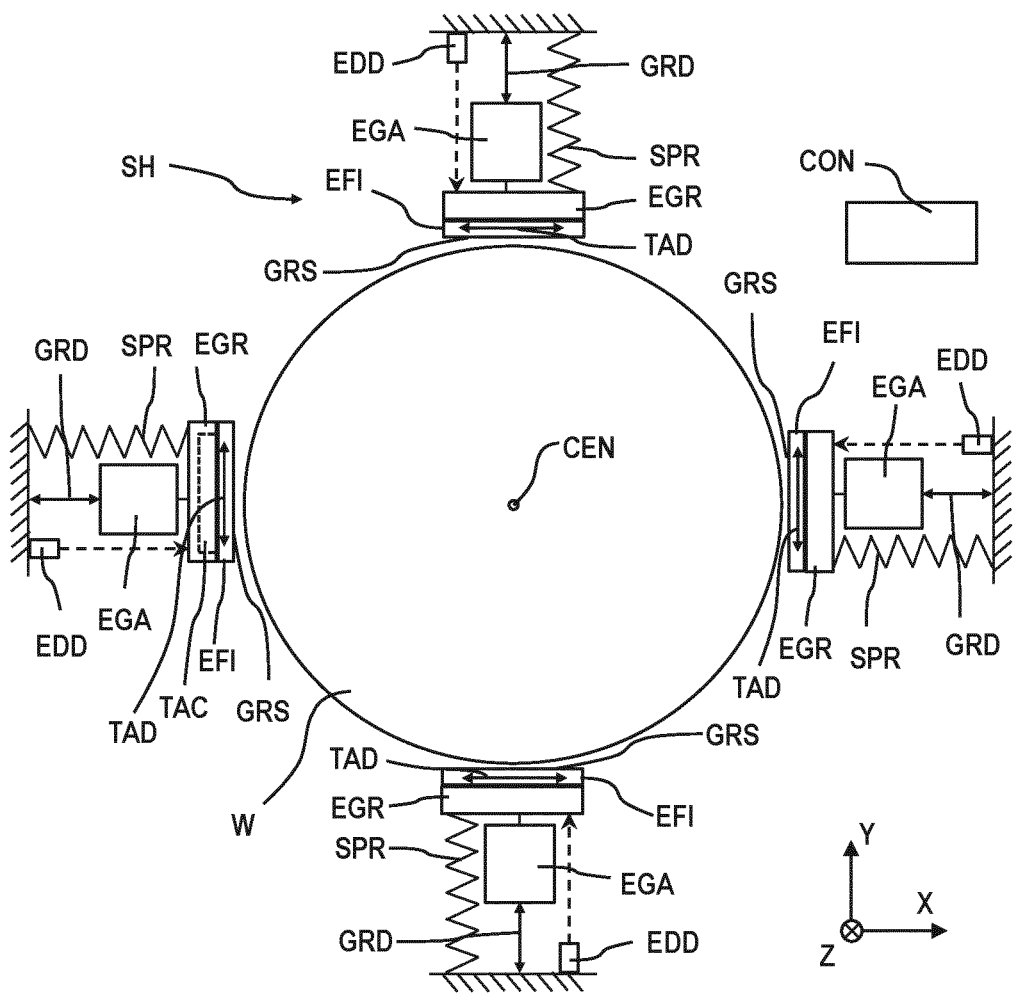

FIGS. 6 and 7 disclose an embodiment of a substrate holder SH according to another aspect of the invention. The substrate holder SH comprises a substrate holder frame SHF and four edge grippers EGR mounted on the substrate holder frame SHF. The four edge grippers EGR are configured to hold a substrate W at a circumferential edge thereof, in a substrate holding position. The substrate holding position is a location defined by the substrate holder SH in which a substrate W held by the substrate holder SH is ideally positioned, i.e. the substrate holder SH is designed to hold a substrate W in the substrate holding position. The four edge grippers EGR are equally distributed around the circumference of the substrate holding position.

In other embodiments, another number of edge grippers EGR may be provided. Not all these edge grippers EGR have to be actively position controlled in radial direction. For example, one or more passive, mechanically pre-loaded edge grippers may be combined with two or more actively position controlled edge grippers. The edge grippers EGR may be distributed over the circumference of the substrate W in any suitable configuration.

The edge grippers EGR comprise edge fingers EFI that are individually movable with respect to the substrate holder frame SHF in a gripping direction GRD. The gripping direction GRD extends in radial direction with respect to a center axis CEN of the substrate holding position. Each edge finger EFI is associated with an edge gripper actuator EGA to move the edge finger EFI in the gripping direction GRD towards or away from the substrate edge of the substrate W.

The edge fingers EFI can be used to hold the substrate by pushing a gripping surface GRS of the edge fingers EFI against the circumferential edge of the substrate W. The gripping surface GRS of the edge fingers EFI act as a friction surface to hold the substrate W mainly by friction fit. The friction surface, or more generally, the gripping surface GRS is convexly shaped in vertical direction. The gripping surface GRS may for example be formed as a partly cylindrical surface, wherein the longitudinal axis of the cylindrical surface extends in horizontal direction when the substrate W is held in an horizontal plane. The advantage of the convex shape of the edge fingers EFI is that the gripping surface GRS may effectively deal with local angles of warped substrates and various shapes and materials at the edge of the substrate W.

Mechanically pre-loaded springs SPR are provided for safety in case the edge gripper actuators EGA would not function properly. As an alternative, or additionally, to increase substrate safety a safety rim (not shown) may be provided at the bottom end of the gripping surface GRS to catch a substrate W in case of malfunctioning of the substrate holder SH.

The substrate holder SH comprises one or more edge detection devices EDD configured to detect whether the one or more edge grippers EGR contact the circumferential edge of the substrate W to be held. The edge detection devices EDD can be used to efficiently grip the substrate W by moving the edge fingers EFI individually in gripping direction GRD towards the edge of the substrate W and stop this movement of each of the one or more edge fingers EFI when it is detected by the respective edge detection device EDD that the respective edge finger EFI contacts the circumferential edge of the substrate W. This has the advantage that each edge finger EFI can be quickly moved to the actual position of the edge of the substrate W instead of an expected position of the edge of the substrate W. When one of the edge fingers EFI has reached the edge, the other edge fingers EFI may continue to move in gripping direction GRD towards the edge until it is detected by the associated edge detection device EDD that a respective edge finger EFI has reached the edge of the substrate W.

In the embodiment shown in FIGS. 6 and 7 the edge detection devices EDD are schematically shown as external sensors. In practice, the edge detection of the edge detection device EDD may for example be based on velocity change of the respective edge finger EFI. When the edge finger EFI contacts the substrate W, the edge finger EFI will rapidly decelerate to zero velocity. An encoder may be provided to measure the velocity with which the edge finger is moved in radial direction. If the measured encoder velocity falls below a certain minimum velocity threshold level, the edge detection device EDD may determine that the edge is reached and movement in radial direction should be stopped.

In another embodiment, the edge detection of the edge detection device EDD may be based on a positioning error change. In the controller CON a pre-defined buffer may be filled with the position of the finger continuously to store the last defined number of samples. If the error in positioning of the edge finger EFI becomes larger than a predetermined threshold error level, it is possible to determine that the edge finger EFI has reached the edge of the substrate W and movement in radial direction should be stopped.

In yet another embodiment, the edge detection of the edge detection device EDD may be based on feedback output change. When the edge finger EFI is approaching the wafer with a constant velocity, the output of the feedback is expected to be relatively small. However, if a contact between edge finger EFI and edge of the substrate W occurs, due to the positioning error, the feedback controller CON starts to increase the actuation force. Thus, when the actuation force exceeds an actuation force threshold, the edge detection device EDD may determine that the edge is reached and movement in radial direction should be stopped.

The first two edge fingers EFI that contact the edge of the substrate W are used for positioning, since two points determine the substrate in-plane position. The further edge fingers EFI, in this example two, can be used to preload the substrate W to the edge fingers EFI and to provide friction force in vertical z-direction.

In an embodiment, the controller CON may be configured to change from position control to velocity control, when the edge detection device EDD has determined that the edge of the substrate is reached to apply the gripping force without undesired oscillation.

The edge gripper actuators EGA allow to reposition the substrate W in x-direction and/or y-direction when the substrate W is held by the edge grippers EGR. This may for example be advantageous when during the gripping of the substrate W it is determined by the controller CON that the substrate W is offset with respect to the substrate holding position of the substrate holder. This may for example be determined on the basis of the timing and/or locations of the edge fingers EFI where the edge detections devices EDD detect that the edge fingers EFI contact the edge of the substrate W. By controlled movement of the edge grippers EGR by the edge gripper actuators EGA the actual position of the substrate with respect to the substrate holding position, i.e. the desired position, can be corrected.

The edge grippers EGR are further designed to allow movement of the edge fingers EFI in a tangential direction TAD with respect to the central axis CEN of the substrate holding position.

One of the edge grippers EGR comprises a tangential actuator TAC. The tangential actuator TAC is for example a piezo actuator. The other edge grippers allow movement of the edge finger EFI in tangential direction TAD, but do not comprise an actuator to actively control this movement in tangential direction. In alternative embodiment, two or more, or all edge grippers EGR may comprise a tangential actuator TAC to control movement of the respective edge fingers EFI in tangential direction TAD.

By actuation of the tangential actuator TAC the edge of the substrate W can be displaced in tangential direction TAD. Since the other edge grippers EGR allow such movement in the tangential direction TAD, such actuated movement of the substrate W in tangential direction will result in rotation of the substrate W in the substrate holder about a central axis of the substrate W, i.e. in Rz-direction, over a limited angle of for example +/−50 mrad, for instance +/−10 mrad.

By subsequent gripping and releasing of the edge fingers EFI on the edge of the substrate W and small rotations of the substrate W in Rz-direction, the substrate W may be rotated over larger angles.

The combination of edge gripper actuators EGA and tangential actuator TAC allow the substrate W to be repositioned in x-direction, y-direction and Rz-direction. This makes correction of the position of the substrate W in any direction in the x-y plane possible. Hereinabove, two embodiments of a substrate holder are shown, one embodiment with movable surface clamping pads which are actively movable in z-direction and another embodiment with edge grippers which are actively movable in radial and/or tangential direction. It is possible to combine both embodiments in a single substrate holder having both surface clamping pads movable in z-direction and edge grippers movable in radial direction. Such combined substrate holder may combine the advantages of each of the substrate holders SH as described with respect to the embodiments of FIGS. 2-7.

The abovementioned substrate holder embodiments may load a substrate onto a support surface of a substrate support that does not have loading pins. A substrate support may have recesses or pockets configured to receive the edge fingers EFI such that the substrate may be lowered and placed on the support surface of the substrate support, before being released by the edge fingers EFI.

In a further embodiment of the abovementioned concept, the support holder may have edge fingers EFI and no surface clamping pads CP.

It may be desirable to load a substrate onto the substrate holder without loading pins and additionally without edge finger grippers EFI. In an embodiment therefore, the substrate holder comprises one or more traction actuators. The substrate can be loaded on the substrate holder without EFI, using traction actuator pads for positioning the substrate in all directions. The traction actuator pads provide control of the substrate in the x-, y- and Rz-directions, which may be combined with the surface clamping pads in the z-, Rx-, and Ry-directions, thereby controlling the substrate in six degrees of freedom. Traction actuators are non-contact pads, and fix a position with the substrate by means of air pressure using air, or pressure created with another medium. The air or other medium used for the traction actuator pads may be supplied or discharged through a number of conduits that may be provided on or in the substrate holder frame SHF.

Alternatively, or additionally, the substrate holder may be configured to detect the position of the substrate on the substrate holder to ensure accurate loading. For example, detectors such as optical cameras may record position data in x, y and Rz to ensure accurate positioning the substrate on the surface of the substrate support. Accuracy on the order of les then 3 µm may be achieved with such a system.

The embodiments of the substrate holder described above, in particular when configured for loading a substrate onto the surface of a substrate support without loading pins, and/or configured to be used with a linear stage displacement system give rise to several advantages. Throughput is increased and overlay accuracy is improved. A gain in time may be used for measuring more overlay markers. Where no loading pins are present in the substrate support, a more uniform and flat support surface is provided, thereby reducing induced substrate unflatness. Substrate loading accuracy is improved and the lifetime of the substrate support is increased by less (edge) wear of the substrate holder. Particle generation and cross-contamination is also prevented by eliminating a takeover of the substrate W via removal of the need for the loading pins.

Hereinabove, different embodiments of substrate holders SH have been described that can be used in a lithographic apparatus LA as shown in FIG. 1. The substrate holder SH may also be used as part of a carrier system to hold substrates in other apparatus used in the lithographic production process, such as substrate measurement or substrate inspection devices. The substrate holder is in particular beneficial when a controlled positioning or controlled shape of the substrate is desired.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate holder to hold a substrate in a substrate holding position, the substrate holder comprising:
   a frame,
   multiple surface clamping devices arranged on the frame to clamp a substrate at an upper surface thereof, wherein the surface clamping devices each have a clamping pad to be arranged on the upper surface of the substrate, the surface clamping pads being movable with respect to each other at least in a first direction substantially perpendicular to the upper surface of the substrate held by the surface clamping pads, and
   one or more actuators to move the surface clamping pads with respect to each other in the first direction, the one or more actuators arranged to actively apply a force to the externals of the surface clamping pads to move the surface clamping pads.

2. The substrate holder of claim 1, wherein the one or more actuators comprise an actuator between the frame and one of the clamping pads to move the respective one of the clamping pads with respect to the frame.

3. The substrate holder of claim 2, wherein the one or more actuators comprise an actuator between each of the clamping pads and the frame to individually move each respective clamping pad with respect to the frame.

4. The substrate holder of claim 1, wherein the frame is deformable, and wherein the one or more actuators are arranged to deform the frame to move the surface clamping pads with respect to each other.

5. The substrate holder of claim 1, wherein the surface clamping pads are movable with respect to each other in at least the vertical direction and wherein the surface clamping pads are configured to freely tilt about one or more horizontal axes.

6. The substrate holder of claim 1, further comprising a controller arranged to control positions of the surface clamping pads with respect to each other.

7. The substrate holder of claim 6, wherein the controller is arranged to control the positions of the surface clamping pads to adapt a shape of the substrate held by the surface clamping devices.

8. The substrate holder of claim 6, wherein a measured shape of the substrate held or to be held by the substrate holder is used as an input for the controller to control the positions of the surface clamping pads to adapt a shape of the substrate held by the surface clamping devices.

9. The substrate holder of claim 6, wherein the controller is arranged to individually activate the surface clamping devices to clamp the upper surface of the substrate.

10. The substrate holder of claim 1, wherein the one or more actuators are piezo actuators.

11. The substrate holder of claim 1, wherein the surface clamping pads are arranged in two or more concentric rings.

12. The substrate holder of claim 11, wherein the number of surface clamping pads of each ring is the same.

13. The substrate holder of claim 12, wherein surface clamping pads of different rings are arranged in rows having a same angle with respect to a central axis of the rings and wherein the rows are equally distributed about the periphery of the rings.

14. The substrate holder of claim 1, further comprising one or more traction actuator pads configured to provide movement in a plane substantially parallel to the upper surface of the substrate when held by the surface clamping pads.

15. The substrate holder of claim 14, further comprising one or more detectors configured to detect a position of the substrate on the substrate holder.

16. The substrate holder of claim 1, further comprising three or more edge grippers to hold the substrate at a peripheral edge thereof.

17. The substrate holder of claim 16, wherein at least one of the three or more edge grippers is individually movable in a gripping direction, wherein the gripping direction extends in a radial direction with respect to a central axis of the substrate holding position, and further comprising an edge gripper actuator to move the at least one of the three or more edge grippers in the gripping direction.

18. The substrate holder of claim 16, further comprising one or more edge detection devices configured to detect whether one or more of the edge grippers contact the peripheral edge of the substrate to be held, and wherein the substrate holder is arranged to, during gripping of the substrate, move each of the one or more of the edge grippers towards the edge of the substrate and stop movement of each of the one or more of the edge grippers when the one or more edge detection devices detect that the respective edge gripper contacts the peripheral edge of the substrate.

19. A carrier system for supporting a substrate, the carrier system comprising the substrate holder of claim 1.

20. A lithographic apparatus comprising the substrate holder of claim 1.

* * * * *